United States Patent [19]

Des Brisay. Jr.

[11] Patent Number: 4,868,511

[45] Date of Patent: Sep. 19, 1989

[54] DIGITAL SEQUENCING CIRCUIT

[75] Inventor: George S. Des Brisay. Jr., Hemet, Calif.

[73] Assignee: Hughes Aircraft Company, Los Angeles, Calif.

[21] Appl. No.: 158,428

[22] Filed: Feb. 22, 1988

[51] Int. Cl.[4] ............ H03K 17/28; H03K 19/20; G11C 11/26

[52] U.S. Cl. .................. 328/75; 328/122; 307/265; 307/445; 377/124; 377/81; 377/73

[58] Field of Search ............ 328/75, 96, 122; 307/291, 265, 445; 377/73, 81, 119, 120, 122, 124, 104

[56] References Cited

U.S. PATENT DOCUMENTS

| | | | |
|---|---|---|---|
| 3,108,227 | 10/1963 | Robinson | 377/104 |
| 3,297,950 | 1/1967 | Lee | 377/78 |
| 3,609,569 | 9/1971 | Todd | 307/445 |
| 3,808,544 | 4/1974 | Walker | 328/75 |
| 4,150,305 | 4/1979 | Streit et al. | 377/120 |
| 4,300,060 | 11/1981 | Yu | 307/291 |
| 4,441,198 | 4/1984 | Shibata et al. | 377/81 |

*Primary Examiner*—Stanley D. Miller
*Assistant Examiner*—Huy Kim Mai
*Attorney, Agent, or Firm*—Steven M. Mitchell; Mark J. Meltzer

[57] ABSTRACT

A digital sequencing apparatus produces a series of contiguous enable gates or strobe signals. The apparatus includes an even number, and at least two alternating stages of cross-coupling NOR gates alternating with cross-coupled NAND gates where one of the cross-coupled NOR gates in each stage has a merged AND gate at one input and one of the NAND gates in each stage has a cross-coupled OR gate at one input. This apparatus produces contiguous enable gates in response to complementary clock inputs to each of the stages upon the input of a start signal to the first two stages of the apparatus.

15 Claims, 4 Drawing Sheets

FOUR STAGE LATCH ADDRESS SEQUENCER LOGIC DIAGRAM.

ELASTIC BUFFER LATCH ADDRESS SEQUENCER TIMING.
HIGH-GOING TERMINATING EDGES OF THE SEQUENCER
OUTPUT STROBES ARE NUMBERED IN SEQUENCE.

DIGITAL SEQUENCING CIRCUIT

BACKGROUND OF THE INVENTION

1. Field of the Invention

This invention relates to a digital sequencing apparatus for producing a series of contiguous enable gates or strobe signals, and can, properly configured, produce a continually repeating series of such contiguous enable gates or strobe signals.

2. Description of the Prior Art

Known devices for generating a sequence or repeating sequence of enable gates or strobe signals utilize a serial-in-parallel-out shift register that can be initialized to begin the sequence. One device shifts a logic "1" through a series of register gates to generate a continuous series of gates, or sequentially circulates a logic "1" among register stages to provide a continuously repeating series of gates. Another known device generates a series of sequential gates by decoding each output stage of a counter. These devices require a much larger number of gates and consume more power and produce considerably more heat than the apparatus of this invention, and thus are less reliable and less efficient.

SUMMARY OF THE INVENTION

This invention relates to a digital sequencing apparatus for producing a series of contiguous strobe signals, also called enabling gates. This apparatus includes an even number of alternating stages also called latches. In one embodiment, the system comprises alternating stages of cross-coupled NOR gates and cross-coupled NAND gates to form alternating NOR and NAND stages or latches. The NOR gate latch includes means for combining a clock signal, called clock pulse divided by two (CP÷2), with the output signal from the next preceding stage of the apparatus to set the NOR gate to its non-quiescent state. One means for combining the CP÷2 signal with the output signal from the next preceding stage for setting a NOR gate latch to its non-quiescent state is an AND gate. One means for combining the CP÷2 signal with the output signal from the next preceding stage for setting a NAND gate latch to its non-quiescent state is an OR gate. Preferably, but not necessarily, such AND and OR gates are merged with their respective NOR and NAND gate latches to avoid signal propagation delays and power dissipation.

Preferably, the cross-coupled NOR gates or latches precede the cross-coupled NAND gates or latches in the apparatus, and, preferably, merged AND/NOR gates precede the merged OR/NAND gates. Alternatively, the merged OR/NAND gates may precede the merged AND/NOR gates, as illustrated in FIG. 5.

The sequencer apparatus, which includes an alternating, even number of stages, at least two in number, utilizes complementary clock signals, called CP÷2 and $\overline{CP÷2}$, to generate a sequential gate or strobe signal, during each half cycle of the clock signal, that is during each half cycle of the $\overline{CP÷2}$ signal and each half cycle of the CP÷2 signal. The sequencing apparatus can tolerate some delay between these two complementary clock signals, provided the CP÷2 signal always follows the $\overline{CP÷2}$ signal. The apparatus will not function properly if the CP÷2 signal precedes the $\overline{CP÷2}$ signal by more than a fraction of a gate delay. Each stage of the apparatus logically combines these clock signals with the output of the next preceding stage in the apparatus to set the stage to its non-quiescent state. In the preferred embodiments, the stage including the merged AND/NOR gates combines the CP÷2 signal with the output signal of the next preceding stage to set the stage to its non-quiescent state. The stage including the merged OR/NAND gate combines the CP÷2 signal with the output signal of the next preceding stage to set the stage to its non-quiescent state.

The $\overline{CP÷2}$ signal is applied to each latch, and resets any latch which had been set. The $\overline{CP÷2}$ signal resets NOR gate latches to their quiescent state when the $\overline{CP÷2}$ signal is a logic "1", i.e., when the $\overline{CP÷2}$ signal is high. The $\overline{CP÷2}$ signal resets NAND gate latches to their quiescent state when the $\overline{CP÷2}$ signal is low or a logic "0."

The sequencer apparatus utilizes a separate signal, called the SET signal, to initiate or start the propagation of contiguous strobe signals or gates through the apparatus. The SET signal is delivered to each of the first two stages in the apparatus. Where the apparatus has cross-coupled NOR gates as the first stage, the SET signal is delivered to a NOR input of the merged AND/NOR gate. The SET signal is also simultaneously delivered to the second stage of such an apparatus as an OR input of its merged OR/NAND gate.

When high, the SET command maintains a nonquiescent state at the Q output of the first stage, and sets all succeeding latches to their quiescent states by allowing their non-quiescent states to propagate out of the apparatus.

When the SET command goes low during a time that the $\overline{CP÷2}$ signal is low, the apparatus is enabled to start propagating a non-quiescent state through the series of latches commencing when the CP÷2 signal goes low, and the $\overline{CP÷2}$ signal goes high. At this time (ignoring propagation delays), the Q output of the first stage, which was being held in its non-quiescent state, goes to its quiescent state (high). Also at this time, the Q output of the second stage goes to its non-quiescent state (high). At the next clock transition, when the complementary clock signals called CP÷2 and $\overline{CP÷2}$ reverse their phases, the Q output of the third stage goes to its non-quiescent state (low) while the Q output of the second stage returns to its quiescent state (low). Thus, the non-quiescent state is propagated through the apparatus at the rate of one stage per half of the clock (CP÷2). If the apparatus includes four stages (A, B, C and D), and the output of the fourth stage is coupled to the input of the first stage, this embodiment produces a repeating, continuous series of four contiguous strobe signals called $Q_A$, $\overline{Q_B}$, $Q_C$ and $\overline{Q_D}$, or their complements.

DESCRIPTION OF THE PREFERRED EMBODIMENT

Figure 1:
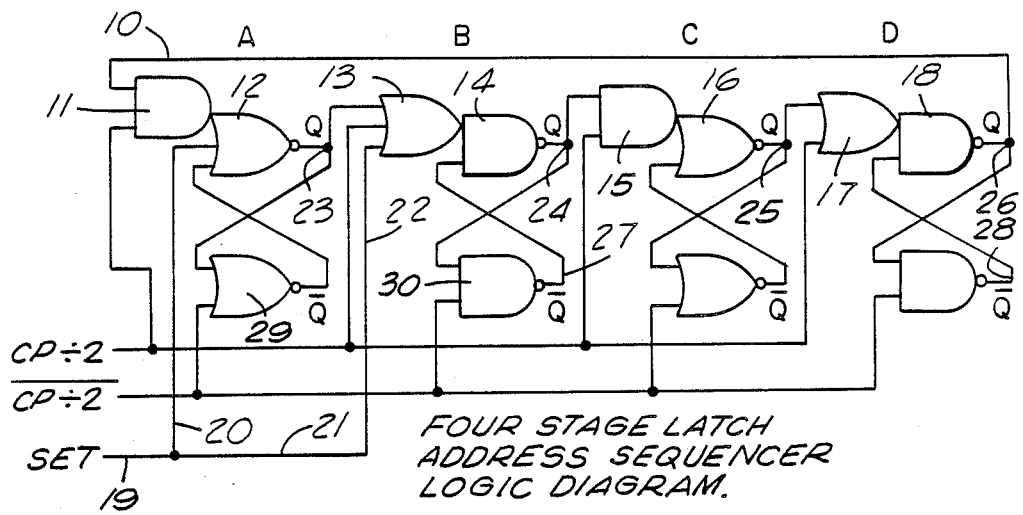
FIG. 1 illustrates, in schematic diagram form, a preferred embodiment of the new sequencer apparatus including four stages labeled A, B, C and D, with cross-coupled NOR stages preceding, and alternating with cross-coupled NAND stages, and with the Q output of the fourth stage coupled to the input of the first stage (four stages are shown, by way of example only, since the device may have any even number of stages)

FIG. 1 shows a four-stage apparatus for generating a repeating series of contiguous gate signals or strobe signals, but any even number of stages can be used. In FIG. 1, stage A includes two cross-coupled NOR gates 12 and 29 with one of the inputs to one of the NOR gates merged with AND gate 11. Stage B, the next succeeding stage in the sequencer, includes two cross-coupled NAND gates 14 and 30 with a merged OR gate 13 at one of the inputs of NAND gate 14. OR gate 13 is connected to one of the outputs of NOR gate 12.

The inputs to stages A and B include complementary clock signals, called the CP÷2 and $\overline{CP÷2}$ signals, and the SET signal. The SET signal is an input to NOR gate 12 in stage A and to OR gate 13 in stage B. The SET signal initiates propagation of a non-quiescent state through the apparatus, and is applied only to the first two stages in the apparatus.

Stage C of the apparatus is similar to stage A, but has no SET signal input and thus its NOR gate has only two inputs instead of three. Stage D is similar to stage B, but has no SET signal input and thus its merged OR gate has only two inputs instead of three. Stage D, however, has its $Q_D$ output at node 26 coupled to AND gate 11 as an input to stage A via path 10.

Figure 2:
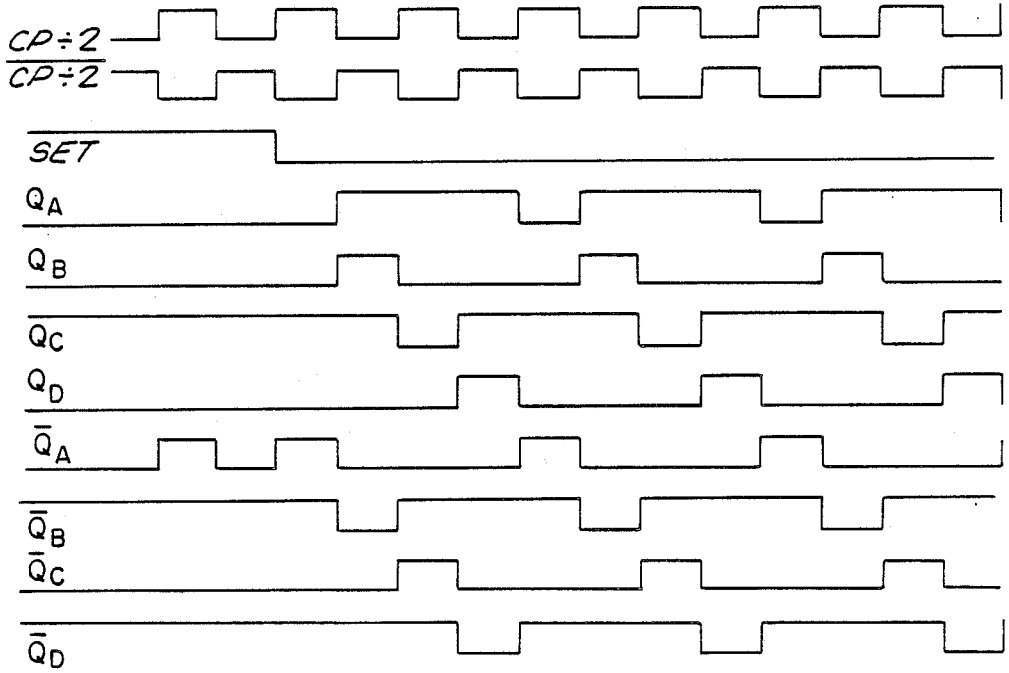
FIG. 2 shows timing diagrams for the input complementary clock signals, called CP÷2 and $\overline{CP÷2}$, and for the input SET signal, to the embodiment of FIG. 1, and for the output signals obtained from the embodiment of FIG. 1, called $Q_A$, $Q_B$, $Q_C$, $Q_D$, $\overline{Q_A}$, $\overline{Q_B}$, $\overline{Q_C}$ and $\overline{Q_D}$.

FIG. 2 shows the timing diagram for input signals to, and output signals from the sequencer apparatus shown schematically in FIG. 1. In FIG. 1, when the CP÷2 signal appears as an input to merged AND/NOR gates 11/12, merged OR/NAND gates 13/14, merged AND/NOR gates 15/16 and merged OR/NAND gates 17/18, the $\overline{CP÷2}$ signal is provided as an input to NOR gate 29, NAND gate 30, NOR gate 31, and NAND gate 32, and the SET signal to AND gate 11 and to OR gate 13 is high, the Q output of latch A at output node 23 is low, constituting a non-quiescent state, and the outputs at the $Q_B$ node 24, $Q_C$ output 25 and $Q_D$ output 26 are all in their quiescent states ($Q_B$ low, $Q_C$ high and $Q_D$ low). When the SET command goes low during a time that the $\overline{CP÷2}$ signal is low, and the CP÷2 signal is high, the sequencer is then enabled to propagate a non-quiescent state through the stages. At this time (when CP÷2 goes low and $\overline{CP÷2}$ goes high), the output at node 23, called $Q_A$, goes high ($\overline{Q_A}$ goes low), and the output at node 24, called $Q_B$, also goes high ($\overline{Q_B}$ goes low). At the next clock transition, when the complementary clock signals CP÷2 and $\overline{CP÷2}$ reverse their phases, the output at $Q_B$ node 24 goes low ($\overline{Q_B}$ goes high), and the output at $Q_C$ node 25 also goes low ($\overline{Q_C}$ goes high), thus propagating a non-quiescent state through the sequencing apparatus at the rate of one stage each half clock cycle. Then, because the output of the D stage, called $Q_D$, is coupled via path 10 to the input of AND gate 11 in the A stage, the sequencer repeats the same sequence and produces a second series of four contiguous gate signals. These four signals are called $Q_A$, appearing at node 23, $\overline{Q_B}$, appearing at node 27, $Q_C$, appearing at node 25, and $\overline{Q_D}$ appearing at node 28.

Preferably, the Q output of each latch remains in its non-quiescent state for at least two full gate propagation delays after the enabling edge of the CP÷2 clock signal enables the succeeding latch stage (positive-going to OR/NAND gates, and negative-going to AND/NOR gates).

For the succeeding latch stage to be fully set to its non-quiescent state, the edges of the CP÷2 signal may not precede the edges of the CP÷2 signal, but may be coincident with, or may follow the edges of the CP÷2 signal.

Figure 3:
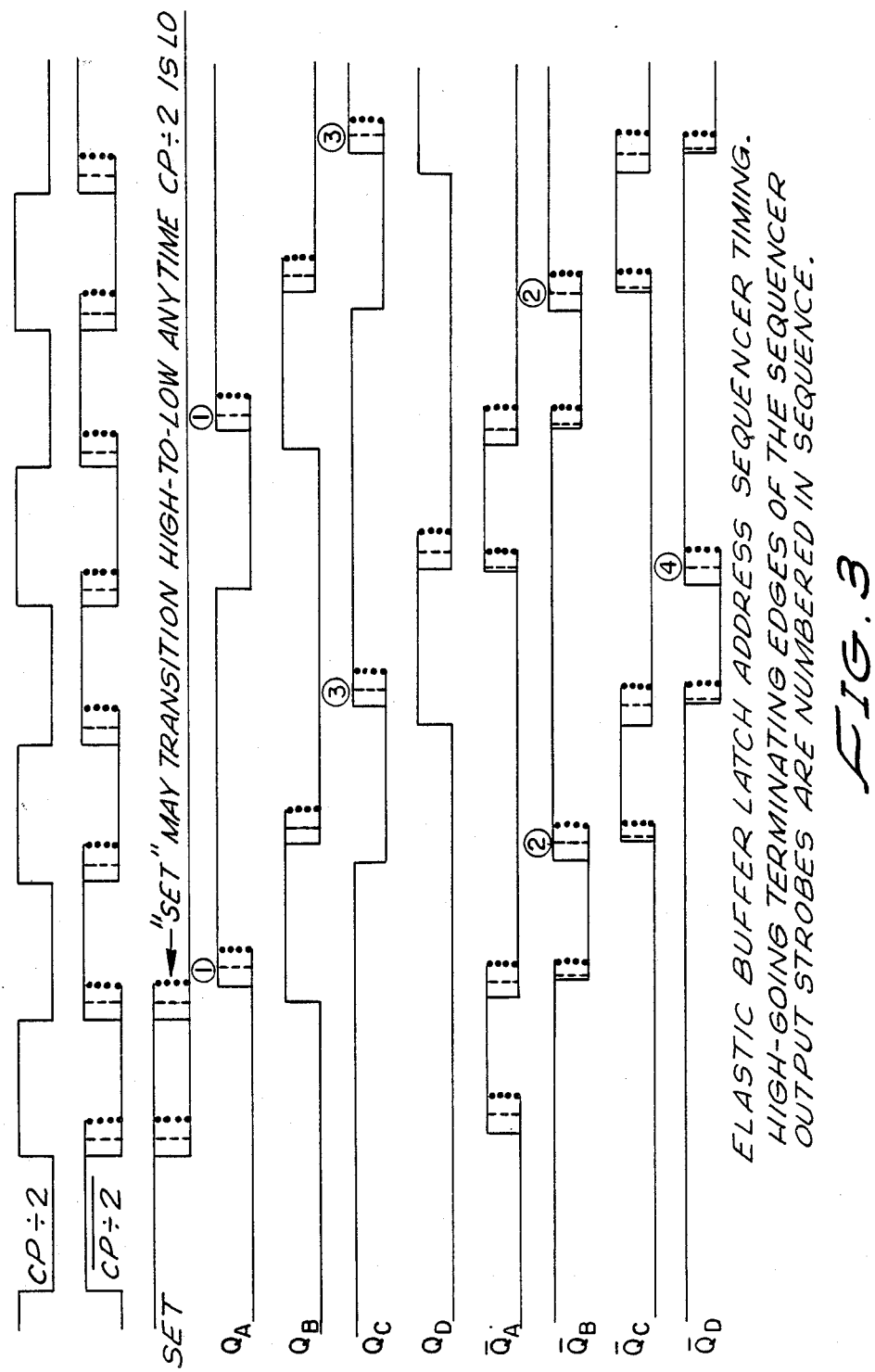
FIG. 3 shows a timing diagram illustrating the effects of propagation delays in the embodiment of FIG. 1 on the timing signals shown in FIG. 2.

A diagram showing the effects of different timing of the CP÷2 signal with respect to the CP÷2 signal appears in FIG. 3. A timing waveform with the $\overline{CP÷2}$ signal coincident with the CP÷2 signal is represented by solid lines. A one gate propagation delay of $\overline{CP÷2}$ with respect to CP÷2 is represented by dashed lines. A two gate propagation delay is represented by dotted lines. Timing of the transition of each Q output to its non-quiescent state is affected only by a CP÷2 signal timing exceeding one gate propagation delay. (In these instances, dashed lines are superimposed on solid lines.)

Figure 4:
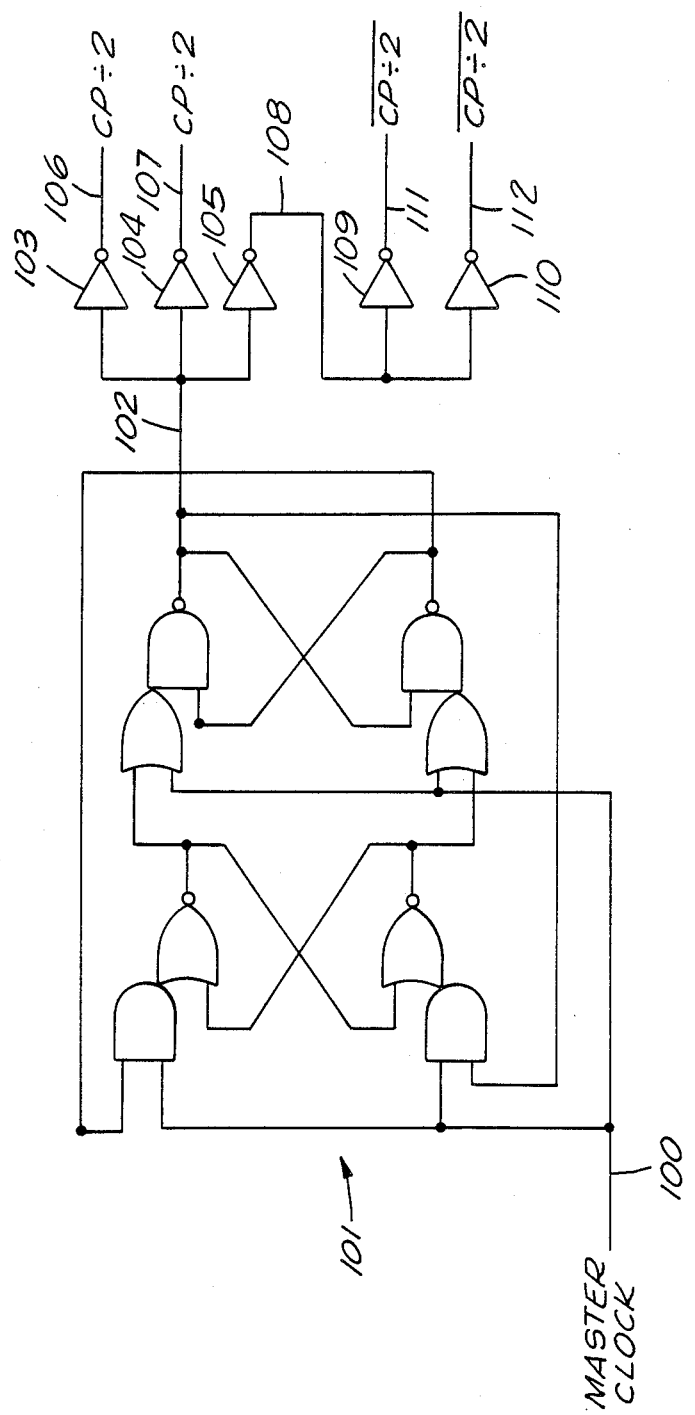
FIG. 4 shows a device for generating complementary clock signals for use with the apparatus of FIG. 1.
Figure 5:
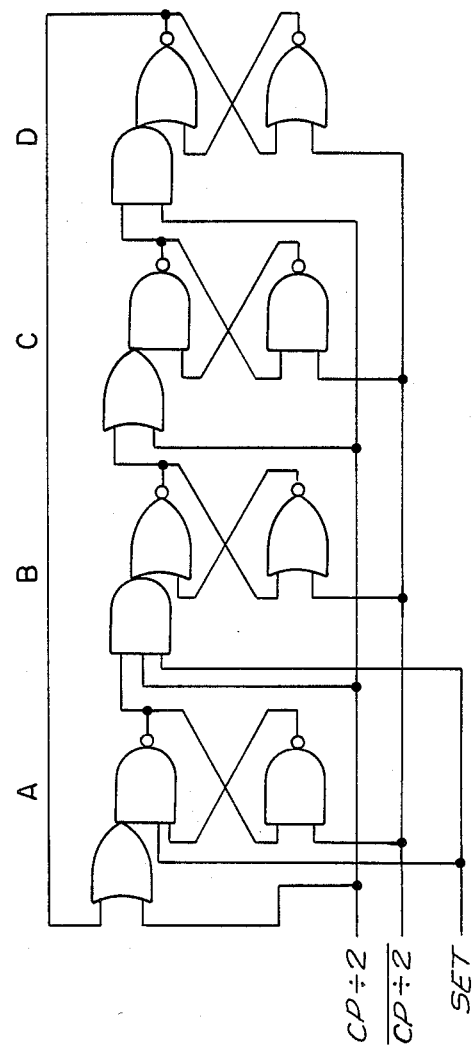
FIG. 5 shows, in schematic diagram form, an alternative form of the preferred embodiment shown in FIG. 1 with the merged OR/NAND gates preceding the merged AND/NOR gates as disclosed above.

FIG. 4 illustrates a device for generating the CP÷2 and $\overline{CP÷2}$ signals. The device comprises a flip-flop followed by some inverter gates. This type of flip-flop has low-to-high transition outputs that are delayed one gate propagation delay from the input clock edges, and high-to-low transition outputs that are delayed two gate propagation delays from the input clock edge. When used to furnish the clock signals to the sequencer, this device of FIG. 4 accomplishes two goals: (1) the $\overline{CP÷2}$ signal is delayed one gate propagation delay from the CP÷2 signal; and (2) the positive-going edges designated by the circled numerals on FIG. 3 each occur at an equal number of gate propagation delays from the input clock edges.

The sequencing apparatus of this invention has many uses. For example, the apparatus can be used to sequentially write data into a memory device, or to sequentially read data from such a memory device. The sequencing apparatus can also be used to align multiple data streams for purposes of multiplexing these data streams into a single, high data rate bit stream. Because this apparatus is a static device, it is also useful at low clock frequencies. Indeed, the device has no minimum clock frequency whatever.

What is claimed is:

1. An apparatus comprising:
    an even number of, and at least two, alternating circuit stages connected to one another, where one of said two alternating stages comprises two cross-coupled NOR gates, with one of said NOR gates having an AND gate at one NOR gate input; and where the other of said two alternating stages comprises two cross-coupled NAND gates, with one of said NAND gates having an OR gate at one NAND gate input;
    wherein said apparatus produces a series of contiguous strobe signals in response to complementary clock signal inputs to each of said circuit stages when an initiating signal is input to first and second circuit stages in said apparatus.

2. The apparatus of claim 1 further comprising means for coupling the output of the last stage in said apparatus to the input of the first stage in said apparatus.

3. The apparatus of claim 1 wherein said cross-coupled NOR gates precede, and alternate with, said cross-coupled NAND gates.

4. The apparatus of claim 1 wherein said cross-coupled NAND gates precede, and alternate with, said cross-coupled NOR gates in stages in said apparatus.

5. The apparatus of claim 1 wherein said AND gate is merged with said one NOR gate input.

6. The apparatus of claim 1 wherein said OR gate is merged with said one NAND gate input.

7. The apparatus of claim 1 wherein said AND gate is merged with said one NOR gate input, and said OR gate is merged with said one NAND gate input.

8. A circuit comprising an even number of stages of alternating first and second types, wherein: said first type of stage comprises first and second NOR gates and an AND gate; a first input of said second NOR gate being connected to an output of said first NOR gate, an output of said second NOR gate being connected to a first input of said first NOR gate, and an output of said AND gate being connected to a second input of said first NOR gate;

said second type of stage comprises first and second NAND gates and an OR gate; a first input of said second NAND gate being connected to an output of said first NAND gate, a first input of said first NAND gate being connected to an output of said OR gate, an output of said first NAND gate being connected to a first input of an AND gate of a succeeding stage of said circuit if there is one and otherwise to said first input of said AND gate of a first stage of said circuit, an output of said second NAND gate being connected to a second input of said first NAND gate; and wherein said circuit produces a series of contiguous strobe signals in response to a clock signal input to a second input of each said AND gate and a second input of each said OR gate, and a complementary clock signal input to a second input of each said NOR gate and a second input of each said NAND gate when an initiating SET signal is input to a third input of said first NOR gate in said first stage of said circuit and to a third input of said OR gate in a second stage of said circuit.

9. The circuit of claim 8 wherein said AND gate of each of said first type of stage is merged with said first NOR gate.

10. The circuit of claim 8 wherein said OR gate of each of said second type of stage is merged with said first NAND gate.

11. The circuit of claim 8 wherein said AND gate of each of said first type of stage is merged with said first NOR gate and said OR gate of each of said second type of stage is merged with said first NAND gate.

12. A circuit comprising an even number of stages of alternating first and second types, wherein:

said first type of stage comprises first and second NAND gates and an OR gate; a first input of said second NAND gate being connected to an output of said first NAND gate, an output of said second NAND gate being connected to a first input of said first NAND gate, and an output of said OR gate being connected to a second input of said first NAND gate;

said second type of stage comprises first and second NOR gates and an AND gate; a first input of said second NOR gate being connected to an output of said first NOR gate, a first input of said first NOR gate being connected to an output of said AND gate, an output of said first NOR gate being connected to a first input of an OR gate of a succeeding stage of said circuit if there is one and otherwise to said first input of said OR gate of a first stage of said circuit, an output of said second NOR gate being connected to a second input of said first NOR gate; and wherein said circuit produces a series of contiguous strobe signals in response to a clock signal inputs to second input of each said OR gate and a second input of each said AND gate, and a complementary clock signal input to a second input of each said NAND gate and a second input of each said NOR gate when an initiating SET signal is input to a third input of said first NAND gate in said first stage of said circuit and to a third input of said AND gate in a second stage of said circuit.

13. The circuit of claim 12 wherein said OR gate of each of said first type of stage is merged with said first NAND gate.

14. The circuit of claim 12 wherein said AND gate of each of said second type of stage is merged with said first NOR gate.

15. The circuit of claim 12 wherein said OR gate of each of said first type of stage is merged with said first NAND gate and said AND gate of each of said second type of stage is merged with said first NOR gate.

* * * * *